United States Patent [19]

Sanwo et al.

[11] Patent Number: 4,800,422

[45] Date of Patent: Jan. 24, 1989

[54] FROSTLESS INTERFACE SUPERCOOLED VLSI SYSTEM

[75] Inventors: Ikuo J. Sanwo, San Marcos; Gregory H. Milby, San Diego, both of Calif.

[73] Assignee: NCR Corporation, Dayton, Ohio

[21] Appl. No.: 46,764

[22] Filed: May 7, 1987

[51] Int. Cl.$^4$ .................. H01L 23/44; H01L /23/46; H01L 23/36

[52] U.S. Cl. ........................................ 357/82; 357/81

[58] Field of Search ................ 357/81, 82; 361/382, 361/385, 389; 165/80.5, 80.4, 104.33, 169

[56] References Cited

U.S. PATENT DOCUMENTS

| | | | |
|---|---|---|---|
| 3,328,642 | 6/1967 | Haumesser et al. | 165/80.4 |
| 3,475,660 | 10/1969 | Coblenz | 357/81 |
| 3,780,356 | 12/1973 | Laing | 357/81 |
| 4,279,127 | 7/1981 | Longsworth | 62/77 |
| 4,395,728 | 7/1983 | Li | 165/80.4 |

FOREIGN PATENT DOCUMENTS

| | | | |
|---|---|---|---|
| 0156238 | 10/1985 | European Pat. Off. | |
| 0190372 | 11/1982 | Japan | 357/82 |
| 1035905 | 7/1966 | United Kingdom | |

OTHER PUBLICATIONS

IBM Journal of Research and Development, vol. 24, No. 2, Mar. 1980 (New York), A. V. Brown: "An Overview of Josephson Packaging".

Proceedings of the 8th International Cryogenic Engineering Conference, 3-6 Jun. 1980 (Genova), vol. ICE-C-8, R. W. Guernsey, Jr.: "Cryogenics for Superconducting Computers".

Primary Examiner—Andrew J. James
Assistant Examiner—S. V. Clark
Attorney, Agent, or Firm—Wilbert Hawk, Jr.; Stephen F. Jewett

[57] ABSTRACT

A double walled vessel having a styrofoam filling between the double walls internally supports a semiconductor circuit to which is attached at least one flat ribbon cable. The semiconductor circuit is immersed in liquid nitrogen with at least one flat ribbon cable extending to the top lip of the vessel. Carbon conductors are connected to each conductor of the flat ribbon cable and extend to the outer wall of the vessel. Another flat ribbon cable is connected to the carbon conductors and to an electrical connector. A double walled top having a styrofoam filling is secured to the vessel such that the carbon conductors are sealed between the styrofoam filling of the top and the double walled vessel thereby preventing the formation of frost on the flat ribbon cable and connector that is external to the sealed vessel. Various tubings are inserted through the double walled vessel to permit the insertion of liquid nitrogen and the drawing off of gaseous nitrogen.

11 Claims, 1 Drawing Sheet

FROSTLESS INTERFACE SUPERCOOLED VLSI SYSTEM

BACKGROUND OF THE INVENTION

The present invention is directed to a system for supercooling a semiconductor device such as a CMOS VLSI chip for the purpose of increasing the speed of the device and for maintaining the interface between the VLSI chip and other systems frostless.

It is well known that for certain electrical conductors the resistance of the conductor decreases when the conductor is supercooled, for example, towards a temperature of $-190$: C. A decrease in resistance tends to increase the speed at which a signal can travel along the conductor. When super cooling temperatures are applied to large scale semiconductor chips of the CMOS type increases in the speed of the signal travel are obtained. One popular medium used for supercooling semiconductor chips is liquid nitrogen. The liquid nitrogen is placed in a vessel with the semiconductor chip and electrical leads connected to the circuits on the chip pass through the liquid nitrogen and out of the vessel to facilitate connection to external electrical systems.

One problem associated with this arrangement is that frost develops on the leads where they exit the vessel and meet with room temperature. This frosting causes interference with the connectors that connect the leads to external electrical systems and when melted causes water pools in proximity to the vessel. Both of these conditions are undesirable. The system of the present invention prevents the formation of frost on the conductors that exit the vessel housing a supercooled very large scale integrated CMOS device.

SUMMARY OF THE INVENTION

The present invention is a system for supercooling a VLSI circuit in a liquid nitrogen filled vessel and for providing an electrical interface to the VLSI circuit from outside of the vessel which interface is maintained frost free.

In a preferred embodiment of the present invention a double walled container having a removable top and a styrofoam filling between the double walls is partially filled with liquid nitrogen. An integrated circuit is electrically connected to one end of a flat ribbon cable and is immersed in the liquid nitrogen. The other end of the flat ribbon cable is connected to individual carbon conductors. The carbon conductors are in turn connected to an electrical connector by means of a second section of flat ribbon cable.

The top of the vessel is clamped to the vessel with the individual carbon conductors sandwiched between the styrofoam of the top and the styrofoam of the vessel so that no frost develops on the carbon conductors or the second section of flat ribbon cable.

It is therefore a primary object of the present invention to provide a frost free system for a supercooled VLSI chip;

It is another object of the present invention to provide a frostless interface for electrical conductors immersed at one end in a supercooled environment and at the other end in a nominal environment.

It is yet another object of the present invention to isolate the temperature extremes of electrical conductors by interposing a carbon conductor in the electrical conductor at the point of temperature transition.

These and other objects of the present invention will become more apparent when taken in conjunction with the following description and drawings wherein like characters indicate like parts and which drawings form a part of the present disclosure.

DESCRIPTION OF THE PREFERRED EMBODIMENT

Figure 1:
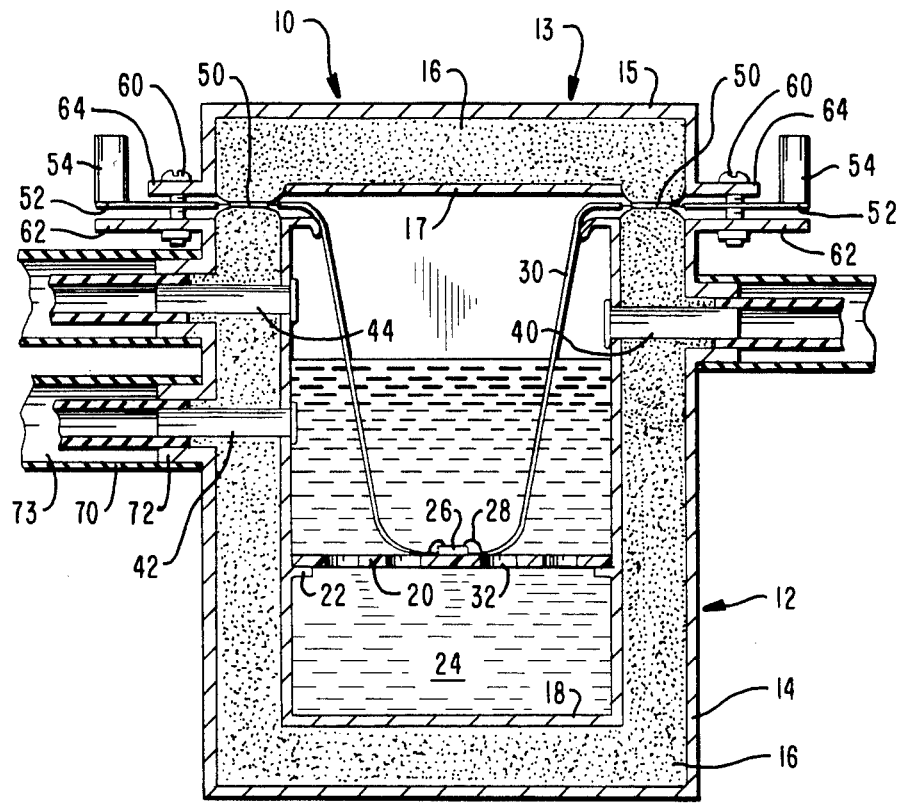
FIG. 1 is a cross sectioned view of the system of the present invention.

Referring to FIG. 1, the system 10 for supercooling the semiconductor chip is shown comprised of a double walled vessel 12 have an outer wall 14, an inner wall 18, and an insulating material 16 filling the void between the two walls which insulating material may be styrofoam. A double walled top assembly 13 having an outer wall 15, an inner wall 17, and an insulating material 16, is attachable to the vessel 12 by means of fasteners 60 which connect to an integral flange 64 on the outer wall 15 of the top assembly and to the flange 62 which is an integral part of the outer wall 14 of the vessel 12. The vessel may be of any particular shape such as cylindrical and/or square without detracting from the teaching of the present invention. A projecting lip 22 extends inward from the inner wall 18 and supports a ceramic platform 20 having openings 32 therethrough to facilitate the flow of a liquid 24 such as liquid nitrogen.

Figure 2:
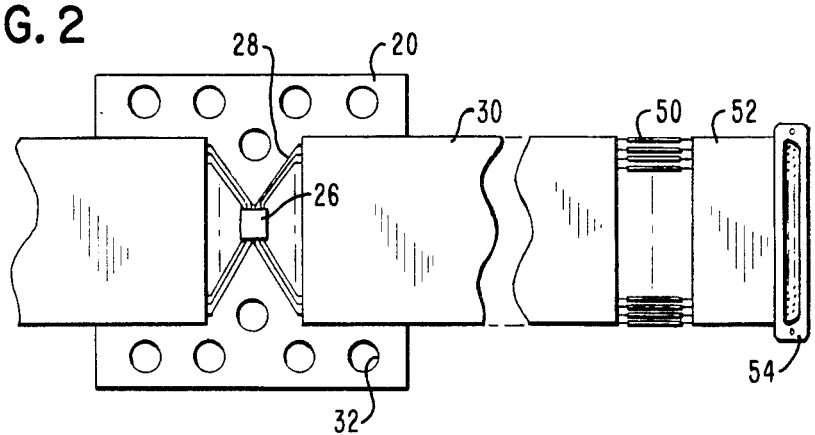
FIG. 2 is an enlarged view of a portion of the system of FIG. 1 illustrating a VLSI chip connected by flat ribbon leads and carbon conductors to an electrical connector.

Referring to FIG. 2 in conjunction with FIG. 1, bonded to the platform 20 is a semi-conductor chip 26, which chip in turn is connected by conductors 28 to a cable 30 which may be a flat conductor ribbon. The ribbon 30 extends upward towards the junction of the top assembly 13 and the vessel 12 to the lip of the inner wall 18. At the approximate location of the lip of the inner wall the ribbon 30 is connected to a plurality of carbon conductors 50 of low ohmic but relatively high thermal insulating value. The carbon conductors 50, in the assembled position, are sandwiched between the styrofoam fill of the top assembly and the styrofoam fill of the vessel. The carbon conductors 50 perform the transformation from the high temperature, relatively speaking, of the exterior of the system to the supercooled inner temperature of the vessel generated by the liquid nitrogen. The carbon conductors are connected to a continuing strip 52 of flat conductor ribbon which ribbon terminates in an electrical connector 54. The connector 54 is connectable to circuitry and or systems designed to interface with the electronics of the chip 26.

An inlet tube 40 and an outlet tube 42 project through the double walls of the vessel 12 and are connected to a supply of cooled liquid nitrogen (no shown for purposes of clarity). The liquid nitrogen ingresses into the vessel 12 via the tube 40 and can move from the vessel by means of tubing 42 so that the nitrogen can be returned to its cooling source. A gas vent tube 44 is provided near the top portion of the vessel above the level of the liquid nitrogen for purposes of collecting gaseous nitrogen and for returning the gas to the supply of cooled liquid nitrogen for conversion to a liquid. In order to eliminate the formation of frost on the tubes 40, 42, and 44 leading into and out of the vessel, outer tubes 70, having a diameter greater than the tubes they enclose, are positioned on flanged portions 72 of the outer vessel wall 14 so as to create an insulating space 73.

The inner wall 18 of the vessel 12 and the inner wall 17 of the top assembly 13 may be formed from a ceramic or metallic type material. The flat conductor ribbon 30 and the associated ribbon 52 may be a polyemide flat ribbon which is electrically connected through embedded wires or other electrical conduction means to the semiconductor chip and the carbon conductors by either thermal compression or soldering. The carbon conductors 50 may be formed from a carbon strip of the type manufactured by Omega-Ply of California and/or may be discrete carbon resistors. In the preferred embodiment of the invention, the semiconductor chip 26 is a very large scale (VLSI) CMOS device. The support assembly 20 may be formed from a PCB board material or ceramic. The ceramic material is preferred.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as fall within the true scope of the invention.

We claim:

1. A system for supercooling a semiconductor chip comprising:
   a double wall vessel;
   a double wall top for sealing said double wall vessel, wherein said double wall vessel and top each have inner and outer walls and a space therebetween;
   a temperature insulating material filling said space;
   a semiconductor chip;
   means within said vessel for supporting said semiconductor chip;
   electrical conductor means connected to said semiconductor chip, said electrical conductor means extending from said semiconductor chip to the top of the inner wall of said vessel;
   carbon conductors connected to said electrical conductor means from the inner wall to the outer wall of said vessel and sandwiched between said temperature insulating material of said vessel and said top;
   electrical conductor means connected to said carbon conductors at the outer wall of said vessel; and
   a supercooling liquid within said vessel covering said semiconductor chip.

2. A system for supercooling a semiconductor chip according to claim 1 and further comprising:
   a fill opening through the double walls of said vessel for adding said supercooling liquid.

3. A system for supercooling a semiconductor chip according to claim 1 wherein said carbon conductors are discrete carbon resistors.

4. A system for supercooling a semiconductor chip according to claim 1 wherein said carbon conductors are carbon ribbon strips.

5. A system for supercooling a semiconductor chip comprising:
   a vessel;
   a top for sealing said vessel at a juncture between said vessel and said top;
   a semiconductor chip;
   mounting means for mounting said semiconductor chip in said vessel;
   cabling means for electrically coupling signals from said semiconductor chip to a connector positioned outside of said vessel;
   carbon conductors interposed in said cabling means at a position corresponding to said juncture; and
   a supercooling liquid covering said semiconductor chip in said vessel.

6. The system for supercooling a semiconductor chip according to claim 5 wherein said carbon conductors are discrete carbon resistors.

7. The system for supercooling a semiconductor chip according to claim 5 wherein said carbon conductors are carbon ribbon strips.

8. The system for supercooling a semiconductor chip according to claim 5 wherein said semiconductor chip is a VLSI CMOS chip.

9. The system for supercooling a semiconductor chip according to claim 5 wherein said vessel and said top are lined with a styrofoam material.

10. The system for supercooling a semiconductor chip according to claim 9 wherein said styrofoam material is lined with a liner of ceramic material.

11. A system for supercooling a semiconductor chip comprising:
    an insulated vessel;
    a semiconductor chip;
    mounting means for mounting said semiconductor chip inside said vessel;
    cabling means for electrically coupling signals from said semiconductor chip to a connector positioned outside of said vessel;
    thermally insulating, electrical conductors interposed in said cabling means from inside to outside said vessel; and
    a supercooling liquid covering said semiconductor chip inside said vessel.

* * * * *